United States Patent [19]
Otani

[11] Patent Number: 6,093,576
[45] Date of Patent: Jul. 25, 2000

[54] SEMICONDUCTOR SENSOR AND MANUFACTURING METHOD THEREOF

[75] Inventor: Hiroshi Otani, Tokyo, Japan

[73] Assignee: Mitsubishi Denki Kabushiki Kaisha, Tokyo, Japan

[21] Appl. No.: 08/974,499

[22] Filed: Nov. 19, 1997

Related U.S. Application Data

[62] Division of application No. 08/567,411, Dec. 5, 1995, abandoned.

[30] Foreign Application Priority Data

Aug. 29, 1995 [JP] Japan .................... 7-220296

[51] Int. Cl.[7] .......................... H01L 21/44; H01L 21/48; H01L 21/50; H01L 21/00
[52] U.S. Cl. .................. 438/5; 438/118; 438/127
[58] Field of Search ................. 438/5, 118, 127

[56] References Cited

U.S. PATENT DOCUMENTS

| 4,523,371 | 6/1985 | Wakashima . |
|---|---|---|
| 5,436,492 | 7/1995 | Yamanaka . |
| 5,893,723 | 4/1999 | Yamanaka . |

FOREIGN PATENT DOCUMENTS

| 58-106851 | 6/1983 | Japan . |
|---|---|---|
| 4133455 | 5/1992 | Japan . |

*Primary Examiner*—John F. Niebling
*Assistant Examiner*—Josetta Jones

[57] ABSTRACT

A manufacturing method produces a semiconductor pressure sensor having a silicon sensor element by electrically connecting a leading frame to the sensor element, and adhering a resin package, e.g., made of PPS resin or PBT resin, for covering the sensor element to the leading frame. Before adhering the package and the leading frame, the manufacturing method applies ultraviolet rays with short wave length to each contact portion of the package and lead frame to improve the adhesive characteristics thereof.

11 Claims, 4 Drawing Sheets

SEMICONDUCTOR SENSOR AND MANUFACTURING METHOD THEREOF

This application is a divisional of application Ser. No. 08/567,411, now abandoned, filed on Dec. 5, 1995, the entire contents of which are hereby incorporated by reference.

FIELD OF THE INVENTION

The present invention relates to a semiconductor sensor such as a semiconductor pressure sensor, a semiconductor acceleration sensor and so on, and to a manufacturing method of the semiconductor sensor.

DESCRIPTION OF THE PRIOR ART

Recently, various semiconductor sensors such as a semiconductor pressure sensor, a semiconductor acceleration sensor and so on prevail widely. Hereupon, a semiconductor sensor means a sensor in which semiconductor is utilized. In such a conventional semiconductor sensor, generally, a sensor element formed of semiconductor, for example a silicon chip, is covered with a package made of resin (a plastic package). Thus, when pressure or acceleration is applied to the sensor element, an elastic distortion is caused in the sensor element so that its electrical characteristic (for example, electrical resistance etc.) changes. Then, the change of the electrical characteristic is outputted as an electrical signal, in other words, the elastic distortion is converted to the electrical signal, and then the pressure or the acceleration is detected in accordance with the electrical signal.

Thus, in the conventional semiconductor sensor, it is probable that an irregular distortion is caused in the sensor element according to a thermal stress generated by a linear expansion coefficient (thermal expansion coefficient) difference between the sensor element and the package in time of the assembling step thereof (generally, the linear expansion coefficient of resin is larger than that of the sensor element), or according to a thermal stress generated by a temperature change after the assembling step. Then, if the above-mentioned irregular distortion is caused in the sensor element, there occurs such a problem that the accuracy of the pressure or the acceleration detected thereby is reduced.

Therefore, in the conventional semiconductor sensor in which the sensor element is disposed within the package, in general, the package is made of epoxy resin or phenolic resin having a relatively small linear expansion coefficient, the linear expansion coefficient being considerably similar to that of the sensor element (for example, a silicon chip). Consequently, the thermal stress caused in time of or after the assembling step is reduced so that the above-mentioned problem is solved.

However, each of the epoxy resin and the phenolic resin, which has been conventionally used for the semiconductor sensor, is thermosetting resin which requires a very complicated (therefore expensive) molding procedure such as a transfer molding, a compression molding or the like. Therefore, when the above-mentioned thermosetting resin is used for the semiconductor sensor, there occurs such a problem that the manufacturing cost of the package (in its turn, the manufacturing cost of the semiconductor sensor) is considerably increased in comparison with the procedure using thermoplastic resin which can be molded by a simple (therefore inexpensive) molding procedure such as an injection molding.

Thus, in order to reduce the manufacturing cost of the package, there has been examined such a procedure as to use polyphenylene sulfide resin (Hereinafter "PPS resin") or polybutylene terephthalate resin (Hereinafter "PBT resin") as a raw material of the package, each of the PPS resin and the PBT resin being thermoplastic resin having a relatively small linear expansion coefficient. However, since each of the PPS resin and the PBT resin has a lower polarity and a higher crystallization tendency, the adhesive strength between the resin and other members such as the sensor element, a leading frame etc. is weak. Therefore, there occurs such a problem that the reliability of the connecting portion of the semiconductor sensor is reduced.

Further, in a semiconductor sensor in which the sensor element is enclosed in a hollow portion of the package by a potting resin, for example a semiconductor acceleration sensor, if the adhesive strength (adhesion) between the potting resin and the package is weak, there occurs such a problem that the airtightness of the closed hollow portion, in which the sensor element is enclosed, is reduced.

Hereupon, in order to improve the adhesive strength or the adhesion between the package and the leading frame or the potting resin etc., there may be proposed such a countermeasure as to transform the surface of the package or the leading frame etc. so as to improve the adhesive strength or the adhesion thereof, by using a conventionally well known surface pre-treatment procedure such as a plasma treatment, a corona discharge treatment, a flame treatment or a sand blasting treatment. However, in each of the conventional surface pre-treatments, there are such problems that the cost of an equipment for performing the treatment is very expensive and also the treatment is not suitable for moldings, so that the treatment is hardly applied to the semiconductor sensor.

SUMMARY OF THE INVENTION

The present invention has been developed to solve the above-mentioned conventional problems, and has an object of providing a semiconductor sensor and a manufacturing method thereof, each of which can improve the adhesive strength between a package of the semiconductor sensor and other members adhered thereto so as to improve the reliability of the semiconductor sensor and also to reduce the manufacturing cost of the semiconductor sensor, even if the package of the semiconductor sensor is made of thermoplastic resin, for example PPS resin or PBT resin etc., which has a smaller linear expansion coefficient and can be easily molded.

Further, the present invention has another object of providing a semiconductor sensor in which the sensor element is enclosed in a hollow portion of the package by a potting resin, and a manufacturing method thereof, each of which can improve the airtightness of the closed hollow portion in which the sensor element is enclosed.

Thus, according to a first aspect of the present invention, which is developed to achieve the above-mentioned objects, there is provided a semiconductor sensor comprising a sensor element formed of semiconductor and a package made of resin, the package covering the sensor element, wherein the package is adhered to another member constructing the semiconductor sensor on condition that a contact portion of the package which is adhered to the member, is transformed by applying ultraviolet rays thereto so as to improve an adhesive characteristic thereof.

In the semiconductor sensor according to the first aspect, molecular chains in the contact portion of the package which is adhered to the other member, the contact portion having been applied ultraviolet rays, has been cut by energy of the ultraviolet rays so that the contact portion is preferably transformed, and in result the adhesive characteristic of the contact portion is improved. Further, organic substance on the contact portion has been removed or destroyed by ozone or active oxygen (O) produced due to decomposition of the ozone, the ozone having been produced around the contact portion by the ultraviolet rays, so that the adhesive characteristic of the contact portion is further improved. Consequently, the package and the member are tightly adhered each other so that the reliability of the semiconductor sensor, namely the quality thereof is improved. Further, since the adhesive characteristic of the contact portion is improved as mentioned above, the package can be formed of PPS resin or PBT resin etc., each of which is thermoplastic resin which fundamentally has a lower adhesive characteristic, so that the manufacturing cost of the semiconductor sensor may be reduced.

Further, according to a second aspect of the present invention, there is provided a semiconductor sensor comprising a sensor element formed of semiconductor, a leading frame electrically connected to the sensor element and a package made of resin, the package covering the sensor element and being adhered to the leading frame, wherein the package and the leading frame are adhered each other on condition that each of a contact portion of the package which is adhered to the leading frame and a contact portion of the leading frame which is adhered to the package, is transformed by applying ultraviolet rays thereto so as to improve an adhesive characteristic thereof.

In the semiconductor sensor according to the second aspect, the adhesive characteristic of each of the contact portion of the package and the contact portion of the leading frame, the both contact portions having been applied ultraviolet rays, is improved according to the same mechanism as that of the first aspect. Consequently, the package and the leading frame are tightly adhered each other so that the reliability (quality) of the semiconductor sensor is improved. Further, the package can be formed of PPS resin or PBT resin etc. so that the manufacturing cost of the semiconductor sensor may be reduced, as well as the first aspect.

Furthermore, according to a third aspect of the present invention, a surface of the leading frame is preferably plated with gold. Hereupon, an adhesive characteristic of the leading frame plated with gold is fundamentally (originally) weak. However, in the semiconductor sensor, since the adhesive characteristic of the leading frame is sufficiently improved, as well as the second aspect, the package and the leading frame are tightly adhered each other so that the reliability (quality) of the semiconductor sensor is improved, and also the manufacturing cost of the semiconductor sensor may be reduced.

Moreover, according to a fourth aspect of the present invention, there is provided a semiconductor sensor comprising a substrate, a sensor element formed of semiconductor which is loaded on the substrate and a package made of resin which is adhered to the substrate so as to cover the sensor element, wherein the package is adhered to the substrate on condition that a contact portion of the package which is adhered to the substrate, is transformed by applying ultraviolet rays thereto so as to improve an adhesive characteristic thereof.

In the semiconductor sensor according to the fourth aspect, the adhesive characteristic of the contact portion of the package, the portion having been applied ultraviolet rays, is improved according to the same mechanism as that of the first aspect. Consequently, the package and the substrate are tightly adhered each other so that the reliability (quality) of the semiconductor sensor is improved. Further, the package can be formed of PPS resin or PBT resin etc. so that the manufacturing cost of the semiconductor sensor may be reduced, as well as the first aspect.

In addition, according to a fifth aspect of the present invention there is provided a semiconductor sensor comprising a sensor element formed of semiconductor, a substrate supporting the sensor element and a package made of resin which has a hollow portion therein, one end of the hollow portion being open to an outside of the package, the substrate being adhered to an inner wall of the package, the inner wall forming the hollow portion, and the semiconductor sensor further comprising a potting resin closing the hollow portion against the outside so as to enclose the sensor element and the substrate within the closed hollow portion, wherein the package is adhered to the substrate and the potting resin on condition that the inner wall is transformed by applying ultraviolet rays thereto so as to improve an adhesive characteristic thereof.

In the semiconductor sensor according to the fifth aspect, the adhesive characteristic of the inner wall forming the hollow portion in the package, the inner wall having been applied ultraviolet rays, is improved according to the same mechanism as that of the first aspect. Consequently, the package and the substrate are tightly adhered each other so that the reliability (quality) of the semiconductor sensor is improved. Further, since the package and the potting resin are tightly adhered each other, the airtightness of the closed hollow portion is improved so that the reliability of the semiconductor sensor is still more improved. Moreover, the package can be formed of PPS resin or PBT resin etc. so that the manufacturing cost of the semiconductor sensor may be reduced, as well as the first aspect.

Further, according to a sixth aspect of the present invention, in the semiconductor sensor in accordance with the fifth aspect, the inner wall is formed in a shape of a taper spreading toward the outside. In the semiconductor sensor, fundamentally, there are achieved the same operations and effects as those of the fifth aspect. Further, since the hollow portion spreads toward the outside, the amount of the ultraviolet rays applied to the inner wall increases, namely the applying efficiency of the ultraviolet rays is improved, in comparison with the fifth aspect in time of the step of applying the ultraviolet rays from outside to the inner wall. Consequently, the adhesive characteristic of the inner wall is still more improved so that the reliability of the semiconductor sensor is further improved.

Furthermore, according to a seventh aspect of the present invention, in each of the above-mentioned semiconductor sensors, the package is preferably made of thermoplastic resin having a linear expanding coefficient similar to that of said sensor element. In the semiconductor, fundamentally, there are achieved the same operations and effects as those of any one of the first to sixth aspects. Further, since the linear expansion coefficient of the package is similar to that of the sensor element, thermal stress generated at time of or after the step of assembling the semiconductor sensor, is reduced. Consequently, an irregular distortion is not caused in the sensor element so that the detecting accuracy of the semiconductor sensor is improved.

Moreover, according to a eighth aspect of the present invention, the thermoplastic resin is polyphenylene sulfide resin (PPS) or polybutylene terephthalate resin (PBT). In the semiconductor, fundamentally, there are achieved the same operations and effects as those of the seventh aspect. Further, the package is made of PPS resin or PBT resin, each of which can be easily molded and is inexpensive, the manufacturing procedure of the semiconductor sensor is simplified so that the manufacturing cost of the semiconductor sensor is still more reduced.

In addition, according to a ninth aspect of the present invention, there is provided a manufacturing method of the semiconductor sensor in accordance with the second aspect, the method comprising the steps of electrically connecting the sensor element to the leading frame, transforming each of a contact portion of the package which is adhered to the leading frame and a contact portion of the leading frame which is adhered to the package by applying ultraviolet rays thereto so as to improve an adhesive characteristic thereof, and adhering the package and the leading frame each other.

In the manufacturing method according to the ninth aspect, ultraviolet rays are applied onto the both contact portions. In result, molecular chains in each of the contact portions are cut by energy of the ultraviolet rays so that the both contact portions are preferably transformed, and consequently the adhesive characteristic of each of the contact portions is improved. Further, organic substance on each of the contact portions is removed or destroyed by ozone or active oxygen (O), as well as the case of the first aspect, so that the adhesive characteristic of each of the contact portions is further improved. Consequently, the package and the leading frame are tightly adhered each other so that the reliability (quality) of the semiconductor sensor is improved. Further, since the adhesive characteristic of each of the contact portions is improved, the package can be formed of PPS resin or PBT resin etc. so that the manufacturing cost of the semiconductor sensor may be reduced.

Further, according to a tenth aspect of the present invention, there is provided a manufacturing method of the semiconductor sensor in accordance with the fourth aspect, the method comprising the steps of joining the sensor element to the substrate, transforming a contact portion of the package adhered to the substrate by applying ultraviolet rays thereto so as to improve an adhesive characteristic thereof, and adhering the package to the substrate so as to cover the sensor element.

In the manufacturing method according to the tenth aspect, ultraviolet rays are applied onto the contact portion of the package. In result, the adhesive characteristic of the contact portion is improved according to the same mechanism as that of the ninth aspect. Consequently, the package and the substrate are tightly adhered each other so that the reliability (quality) of the semiconductor sensor is improved. Further, the package can be formed of PPS resin or PBT resin etc. so that the manufacturing cost of the semiconductor sensor may be reduced.

Moreover, according to a eleventh aspect of the present invention, there is provided a manufacturing method of the semiconductor sensor in accordance with the fifth aspect, the method comprising the steps of installing the sensor element to the substrate, transforming the inner wall by applying ultraviolet rays thereto so as to improve an adhesive characteristic thereof, adhering the substrate to the inner wall, and potting the potting resin into the hollow portion so as to enclose the sensor element and the substrate within the hollow portion.

In the manufacturing method according to the eleventh aspect, ultraviolet rays are applied onto the inner wall. In result, the adhesive characteristic of the inner wall forming the hollow portion in the package is improved according to the same mechanism as that of the ninth aspect. Consequently, the package and the substrate are tightly adhered each other so that the reliability (quality) of the semiconductor sensor is improved. Further, since the package and the potting resin are tightly adhered each other, the air tightness of the closed hollow portion is improved so that the reliability of the semiconductor sensor is still more improved. Moreover, the package can be formed of PPS resin or PBT resin etc. so that the manufacturing cost of the semiconductor sensor may be reduced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and other objects, features and advantages of the present invention will become clear from the following description taken in conjunction with the preferred embodiments with reference to the accompanying drawings throughout which like parts are designated by like reference numerals, and in which.

DETAILED DESCRIPTION OF THE PREFERRED EMBODIMENT

Hereinafter, several preferred embodiments of the present invention will be concretely described with reference to the accompanying drawings.

<The First Embodiment>

Figure 1:
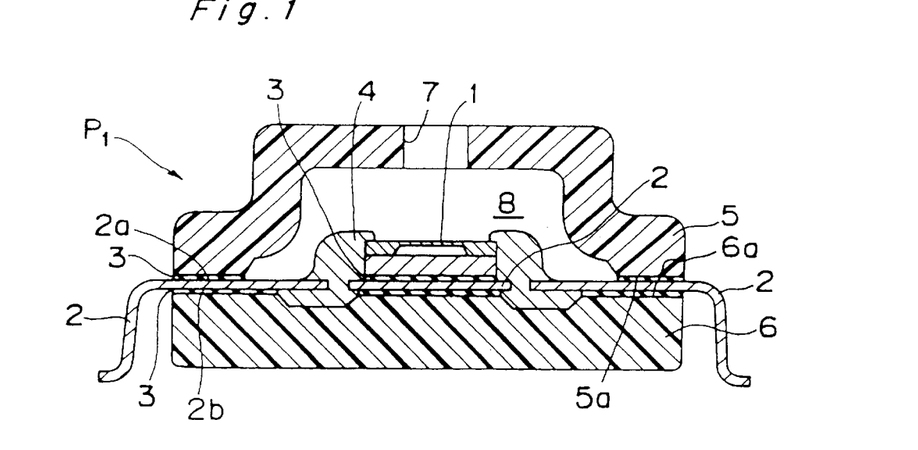
FIG. 1 is a sectional elevational view of a semiconductor sensor according to the first and the second embodiments of the present invention.

FIG. 1 shows a sectional elevational structure of a semiconductor sensor $P_1$ in which a sensor element 1 is covered with a plastic package composed of a cap 5 and a base 6. The semiconductor sensor $P_1$ is a semiconductor pressure sensor which can detect atmospheric pressure. Hereinafter, for the sake of convenience, the cap side in FIG. 1 is merely referred to "upward" or "upper", while the base side in FIG. 1 is merely referred to "downward" or "lower". However, on condition that the semiconductor sensor $P_1$ is actually loaded on any desired structure (apparatus), the above-mentioned upward-downward direction does not always correspond to the actual upward-downward direction of the structure, because the semiconductor sensor $P_1$ can be loaded on the structure with any desired situation.

As shown in FIG. 1, in the semiconductor pressure sensor $P_1$ for detecting atmospheric pressure, the sensor element 1 formed of silicon (semiconductor) which can detect pressure is adhered to a leading frame 2 using preferable adhesive material 3 (die bonding), the leading frame 2 being formed of a metal material having a high electrical conductivity. Thus, the sensor element 1 and the leading frame 2 are electrically connected each other via a bonding wire 4 formed of a metal material having a high electrical conductivity. Further, an assembly, which is substantially composed of the sensor element 1, the leading frame 2 and the bonding wire 4, is covered with the plastic package composed of the cap 5 and the base 6. Hereupon, each of the cap 5 and the base 6 is formed PPS resin or PBT resin, each of which is a thermoplastic resin and has a linear expanding coefficient similar to that of the sensor element 1.

Hence, it is natural that any other resin except PPS resin and PBT resin can be used as the thermoplastic resin forming the plastic package, if only the resin has a relatively small linear expanding coefficient and is inexpensive.

Thus, a lower cap contact portion 5a formed on a part of the lower surface of the cap 5 is adhered to an upper leading frame contact portion 2a formed on a part of the upper surface of the leading frame 2 using the adhesive material 3. Further, an upper base contact portion 6a formed on a part of the upper surface of the base 6 is adhered to a lower leading frame contact portion 2b formed on a part of the lower surface of the leading frame 2 using the adhesive material 3. Hereupon, a through hole 7 is provided in the cap 5, and then a void space 8 formed in the plastic package is opened to the atmosphere namely the outside of the plastic package via the through hole 7. Thus, as will be described below in detail, the lower cap contact portion 5a and the upper base contact portion 6a are tightly adhered to the upper leading frame contact portion 2a and the lower leading frame contact portion 2b, respectively. Hereat, each of the contact portions 5a and 6a has been already transformed by applying ultraviolet rays thereto so that the adhesive characteristic of each of the contact portions 5a and 6a is improved.

The reason why it is required that each of the lower cap contact portion 5a and the upper base contact portion 6a is transformed by ultraviolet rays so as to improve the adhesive characteristic thereof, runs as follows.

Namely, as mentioned above, the semiconductor pressure sensor $P_1$ has such a structure characterized in that the sensor element 1 and the leading frame 2 are adhered each other and also the leading frame 2 and the plastic package (the cap 5 and the base 6) are adhered each other. Consequently, as mentioned in the column of "Description of Prior Art" of the specification, if the plastic package is formed of resin having a linear expanding coefficient greatly different from that of the sensor element 1, it is probable that an irregular distortion is caused in the sensor element 1 due to a thermal stress therein after the adhering step, and/or due to a thermal stress therein generated by an outside temperature change after the completion of the semiconductor sensor $P_1$. In result, the irregular distortion of the sensor element 1 causes an additional irregular output (Hereinafter, the output is referred to "offset output".) so that the pressure detecting accuracy of the semiconductor pressure sensor $P_1$ is reduced.

In order to solve such a problem, according to the first embodiment, the plastic package is formed of PPS resin or PBT resin, each of which can be molded easily namely at a low cost and also has a relatively small linear expanding coefficient so as to reduce its offset output. Further, each of the lower cap contact portion 5a and the upper base contact portion 6a is preferably transformed by applying ultraviolet rays thereto so as to improve the adhesive characteristic thereof so that the reliability of the adhering portion between the plastic package and the leading frame 2 is improved.

The above-mentioned surface transforming procedure by applying ultraviolet rays is such a procedure characterized in that ultraviolet rays having short wave length is applied to the lower cap contact portion 5a and the upper base contact portion 6a, whereby the surface of each of the contact portions 5a and 6a is transformed so that the adhesive characteristic or the adhesion is highly improved, in contrast with conventional well known surface transforming procedures such as a plasma treatment, a corona discharge treatment, a flame treatment or a sand blasting treatment etc. Thus, there is easily provided a semiconductor sensor with a high reliability namely a high quality at a low cost.

Hereinafter, a manufacturing method of the semiconductor pressure sensor $P_1$ will be concretely described with reference to FIG. 1, according to the flow chart shown in FIG. 2A.

Figure 2A:
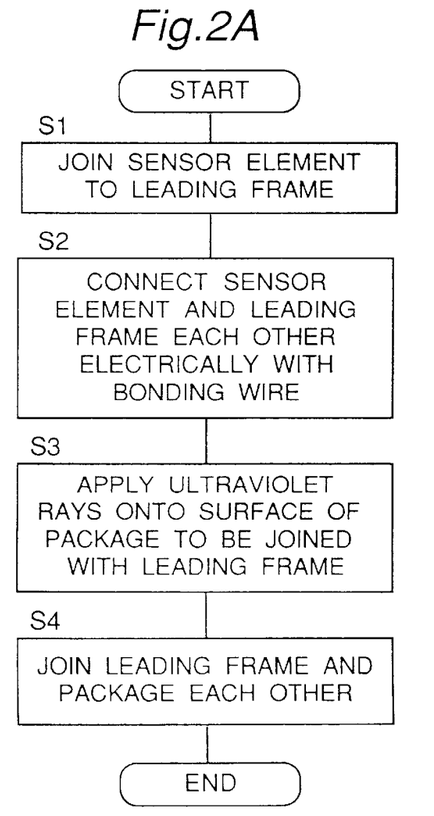
FIG. 2A is a flow chart showing a manufacturing method of the semiconductor sensor according to the first embodiment.

As shown in FIG. 2A, in the manufacturing method of the semiconductor pressure sensor $P_1$, at first the sensor element 1 is joined to the leading frame 2 using the preferable adhesive material 3 (Step S1). Then, the sensor element 1 and the leading frame 2 are electrically connected each other with the bonding wire 4 (Step S2).

Next, ultraviolet rays are applied onto the surface of each of potions of the plastic package which are to be joined (adhered) to the leading frame 2, namely the lower cap contact portion 5a and the upper base contact portion 6a so that the both contact portions 5a and 5b are transformed (Step S3). The ultraviolet rays used in Step S3 is such a type of ultraviolet rays as is generally called far ultraviolet rays. Hereupon, it is preferable that far ultraviolet rays with short wave length, particularly far ultraviolet rays with wave length of 184.9 nm and/or far ultraviolet rays with wave length of 253.7 nm are/is used as the ultraviolet rays.

The above-mentioned transformation of each of the lower cap contact portion 5a and the upper base contact portion 6a by applying ultraviolet rays is caused by means of a strong oxidation operation of ozone ($O_3$) generated around the contact portions 5a and 6a by ultraviolet rays (particularly the two kind of far ultraviolet rays with wave length of the above-mentioned values) or active oxygen (O) generated due to the decomposition of the ozone, and by means of cutting of molecular chains caused by strong energy of the ultraviolet rays with short wave length.

More concretely, there are caused decomposition of oxygen ($O_2$) and formation of ozone ($O_3$) and decomposition thereof by the two kind of ultraviolet rays with wave length of the above-mentioned values so that active oxygen (O) is generated. Then, molecules of contaminative substances adhering on the lower cap contact portion 5a and the upper base contact portion are oxidized by the active oxygen (O), and further the surface of each of the contact portions 5a and 6a absorbs ultraviolet rays so as to be activated thereby so that organic substances on the contact portions 5a and 6a are removed or destroyed by the combination of the above-mentioned oxidation and activation. Further, when the molecular chains are cut on the surface of each of the contact portions, oxygen reacts or combine to the surface so that a polar group such as a carboxyl group, a carbonyl group or the like is generated or introduced there, consequently the adhesive characteristic of the surface is improved. Thus, the adhesive strength between the leading frame 2 and each of the cap 5 and the base 6, each of which is made of PPS resin or PBT resin, is improved by the surface cleaning operation and the increase of the polar group by applying ultraviolet rays.

Then, the leading frame 2 and the plastic package (the cap 5 and the base 6) are joined (adhered) each other using the preferable adhesive material 3 (Step S4). More concretely, the lower cap contact portion 5a and the upper leading frame contact portion 2a are joined each other using the adhesive material 3, and then the upper base contact portion 6a and the lower leading frame contact portion 2b are joined each other using the adhesive material 3 so that the semiconductor pressure sensor $P_1$ is completed.

Thus, there is provided an inexpensive semiconductor pressure sensor which can detect pressure with a high detecting accuracy, and also has a good reliability (namely, a good quality) and a good adhesive strength.

<The Second Embodiment>

In the above-mentioned semiconductor pressure sensor according to the first embodiment, each of the lower cap contact portion 5a and the upper base contact portion 6a is transformed by applying ultraviolet rays. In contrast with the above, in the semiconductor pressure sensor according to the second embodiment, further each of the upper leading frame contact portion 2a and the lower leading frame contact portion 2b is also transformed by applying ultraviolet rays so that the adhesive characteristic is improved.

Thus, in the semiconductor pressure sensor according to the second embodiment, in comparison with the semiconductor pressure sensor according to the first embodiment, the leading frame 2 and the plastic package (the cap 5 and the base 6) are more tightly joined (adhered) each other so that the adhesive strength consequently the reliability (quality) of the semiconductor pressure sensor is still more improved.

By the way, it is generally probable that the leading frame 2 is plated with gold. In that case, according to the conventional adhering procedure, there is such a problem that the adhesive strength between the leading frame 2 and the plastic package (the cap 5 and the base 6) is particularly reduced. However, in the semiconductor pressure sensor according to the second embodiment, since the adhesive characteristic between the leading frame 2 and the plastic package (the cap 5 and the base 6) is highly improved as described above, the both members sufficiently and tightly joined (adhered) each other even if the leading frame 2 is plated with gold. Therefore, particularly, the second embodiment will be efficiently applied to the semiconductor pressure sensor in which the leading frame 2 is plated with gold.

Figure 2B:
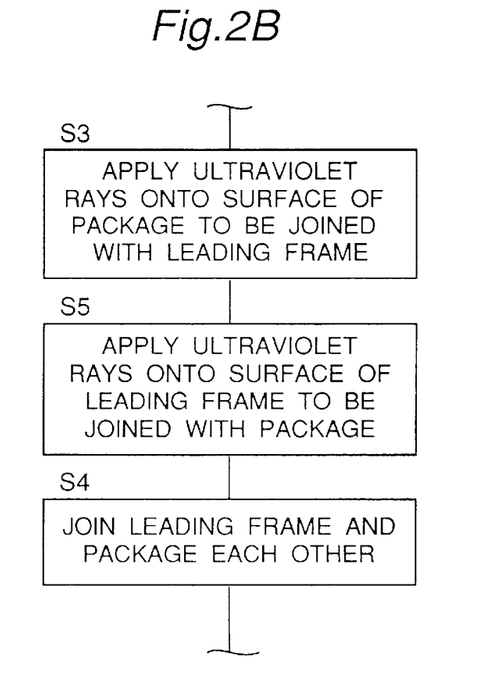
FIG. 2B is a flow chart showing a manufacturing method of the semiconductor sensor according to the second embodiment.

As shown in FIG. 2B, when the semiconductor pressure sensor according to the second embodiment is manufactured, an additional Step S5, in which each of the upper leading frame contact portion 2a and the lower leading frame contact portion 2b is transformed by applying ultraviolet rays, may be inserted between Step S3 and Step S4 in the flow chart according to the first embodiment (see FIG. 2A). Then, the other steps except Step S5 are same as that of the first embodiment.

<The Third Embodiment>

Hereinafter, the third embodiment of the present invention will be described.

Figure 3:
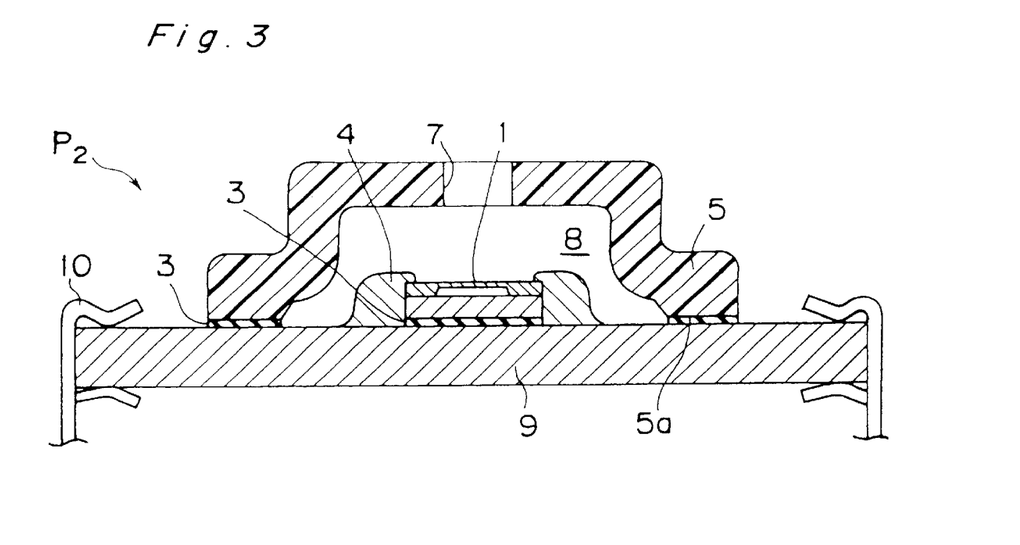
FIG. 3 is a sectional elevational view of a semiconductor sensor according to the third embodiment of the present invention.

FIG. 3 shows a sectional elevational structure of a COB-type of semiconductor pressure sensor $P_2$, in which a sensor element 1 is directly loaded on the upper surface of a substrate 9, and then a cap 5 (plastic package) is joined (adhered) to the upper surface of the substrate 9 so as to cover the sensor element 1. In the semiconductor pressure sensor $P_2$ shown in FIG. 3, members common to those in the semiconductor pressure sensor $P_1$ shown in FIG. 1 have the same reference numerals. Hereinafter, for the sake of convenience, the cap side in FIG. 3 is merely referred to "upward" or "upper", while the substrate side in FIG. 3 is merely referred to "downward" or "lower". However, on condition that the semiconductor pressure sensor $P_2$ is actually loaded on any desired structure, the above-mentioned upward-downward direction does not always correspond to the actual upward-downward direction of the structure, because the semiconductor sensor $P_2$ can be loaded on the structure with any desired situation.

As shown in FIG. 3, in the semiconductor pressure sensor $P_2$ for detecting atmospheric pressure, the sensor element 1 formed of silicon (semiconductor) which can detect pressure is adhered to the upper surface of the substrate 9 using an adhesive material 3 (die bonding). Thus, the sensor element 1 and the substrate 9 are electrically connected each other via a bonding wire 4. Hereat, the sensor element 1 and the bonding wire 4 are covered with the cap 5 (plastic package) adhered to the upper surface of the substrate 9. Hereupon, the cap 5 is formed of PPS resin or PBT resin, each of which is a thermoplastic resin and has a linear expanding coefficient similar to that of the sensor element 1. Further, each of the opposite ends of the substrate 9 is connected to an outer lead 10 formed of electrically conductive metal respectively. Furthermore, a through hole 7 is provided in the cap 5, and then a void space 8 formed in the cap 5 is opened to the atmosphere via the through hole 7.

Hence, it is natural that any other resin except PPS resin and PBT resin can be used as the thermoplastic resin forming the cap 5, if only the resin has a relatively small linear expanding coefficient and is inexpensive.

Thus, a lower cap contact portion 5a formed on a part of the lower surface of the cap 5 is adhered to the substrate 9 using the adhesive material 3. Hereupon, the lower cap contact portion 5a is transformed by applying ultraviolet rays to improve its adhesive characteristic, as well as the case of the first embodiment, so that the contact portion 5a is tightly adhered to the substrate 9.

Hereinafter, a manufacturing method of the semiconductor pressure sensor $P_2$ will be concretely described with reference to FIG. 3, according to the flow chart shown in FIG. 4.

Figure 4:
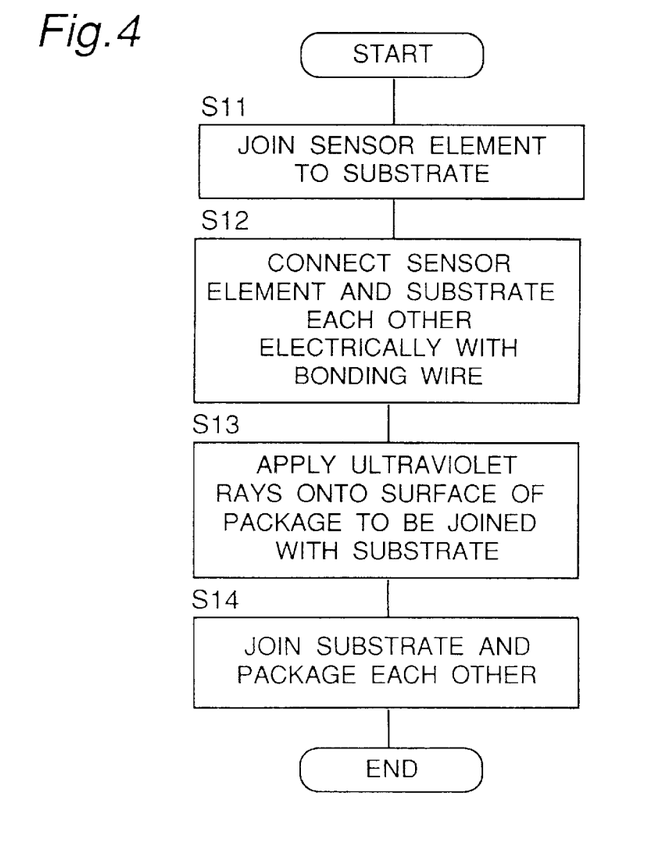
FIG. 4 is a flow chart showing a manufacturing method of the semiconductor sensor according to the third embodiment.

As shown in FIG. 4, in the manufacturing method of the semiconductor pressure sensor $P_2$, at first the sensor element 1 is joined to the substrate 9 using the preferable adhesive material 3 (Step S11). Then, the sensor element 1 and the substrate 9 are electrically connected each other with the bonding wire 4 (Step S12).

Next, ultraviolet rays are applied onto the surface of a potion of the cap 5 (plastic package) which is to be joined (adhered) to the substrate 9, namely the lower cap contact portion 5a, so that the contact portion 5a is transformed (Step S13). The procedure for applying ultraviolet rays and the operations and effects thereof are as same as those of the first embodiment.

Then, the lower cap contact portion 5a is joined to the substrate 9 using the preferable adhesive material 3 so that the semiconductor pressure sensor $P_2$ is completed (Step S14).

Thus, in the semiconductor pressure sensor $P_2$ according to the third embodiment, also, its detecting accuracy of pressure is improved, the adhesive strength consequently the reliability (quality) thereof are improved, and then the manufacturing cost thereof is reduced, as well as the semiconductor pressure sensor $P_1$ according to the first embodiment.

<The Fourth Embodiment>

Hereinafter, the fourth embodiment of the present invention will be described.

Figure 5:
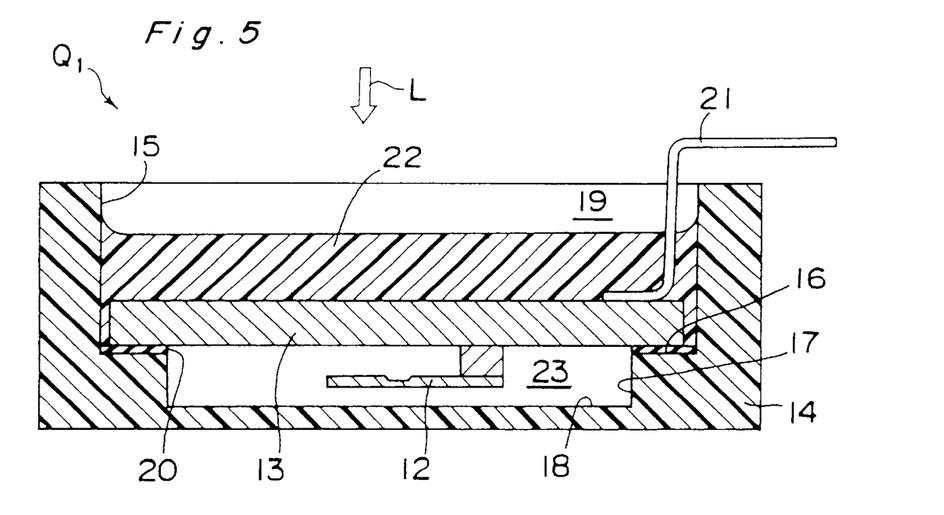
FIG. 5 is a sectional elevational view of a semiconductor sensor according to the fourth embodiment of the present invention.

FIG. 5 shows a sectional elevational structure of a closed type of semiconductor acceleration sensor $Q_1$, in which a sensor element 12 and a substrate 13 supporting the sensor element 12 are enclosed within a hollow portion 19 formed in a plastic package 14 by a potting resin 22. Hereinafter, for the sake of convenience, the open end side of the plastic package 14 in FIG. 5 is merely referred to "upward" or "upper", while the closed end side of the plastic package 14 in FIG. 5 is merely referred to "downward" or "lower". However, on condition that the semiconductor acceleration sensor $Q_1$ is actually loaded on any desired movable body, the above-mentioned upward-downward direction does not always correspond to the actual upward-downward direction of the movable body, because the semiconductor acceleration sensor $Q_1$ can be loaded on the movable body with any desired situation.

As shown in FIG. 5, in the semiconductor acceleration sensor $Q_1$ for detecting acceleration of a movable body (not shown), the sensor element 12 formed of silicon (semiconductor) which can detect the acceleration is installed (joined) to the lower surface of the substrate 13, and then the substrate 13 is adhered to an inner wall of the plastic package 14. specifically, the plastic package 14 is a half-open type of hollow member having a hollow portion 19 whose upper end is opened outward (atmosphere), the hollow portion 19 being formed by a larger radius inner wall portion 15, a pedestal shape inner wall portion 16, a smaller radius inner wall portion 17 and a bottom inner wall portion 18. Hereat, the plastic package 14 is formed of PPS resin or PBT resin, each of which is a thermoplastic resin and has a linear expanding coefficient similar to that of the sensor element 12. Hence, it is natural that any other resin except PPS resin and PBT resin can be used as the thermoplastic resin forming the plastic package 14, if only the resin has a relatively small linear expanding coefficient and is inexpensive.

Thus, the substrate 13 is adhered to the upper surface of the pedestal shape inner wall 16 using a preferable adhesive material 20 on such a condition that the sensor element 12 is situated at the lower side. Further, an outer lead 21 formed of electrically conductive metal is electrically connected to the upper surface of the substrate 13. Moreover, a part of the hollow portion 19 which is situated above the substrate 13 or the pedestal shape inner wall 16, is filled (potted) with the potting resin 22 so that a closed hollow portion 23 in which the sensor element 12 is enclosed, is formed under the substrate 13, the closed hollow portion 23 being a part of the hollow portion 19.

Hereupon, the inner wall (namely inner wall portions 15–18) of the plastic package 14 is transformed by applying ultraviolet rays oriented in the direction indicated by an arrow L so as to improve its adhesive characteristic so that the inner wall is tightly adhered to the substrate 13 and the potting resin 22. Consequently, in the semiconductor acceleration sensor $Q_1$, as well as the case of the first embodiment, the adhesive characteristic between the pedestal shape inner wall portion 16 of the plastic package 14 and the substrate 13 is sufficiently improved so that the both member are tightly adhered each other. Further, the larger radius inner wall portion 15 of the plastic package 14 and the potting resin 22 are tightly adhered each other so that the airtightness of the closed hollow portion 23 in which the sensor element 12 is enclosed, is improved.

Hereupon, ultraviolet rays may be only applied to the larger radius inner wall portion 15 and the pedestal shape inner wall portion 16 by masking the other inner wall portion 17 and 18, for each of which ultraviolet rays are not required. Thus, in the semiconductor acceleration sensor $Q_1$, its detecting accuracy of acceleration is improved, its adhesive characteristic and airtightness are improved so as to elevate its reliability (namely quality), and then the manufacturing cost thereof is reduced.

Hereinafter, a manufacturing method of the semiconductor acceleration sensor $Q_1$ will be concretely described with reference to FIG. 5, according to the flow chart shown in FIG. 7.

Figure 7:
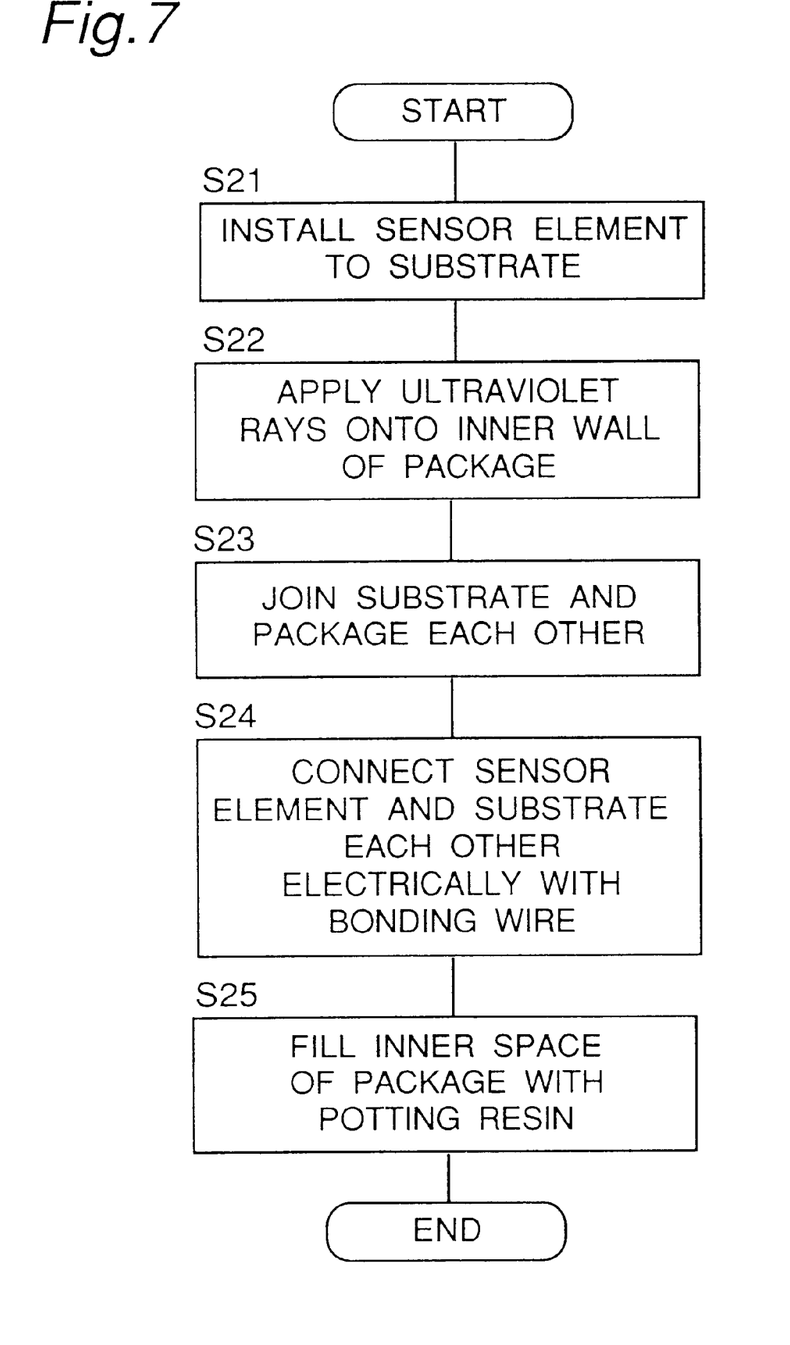
FIG. 7 is a flow chart showing a manufacturing method of the semiconductor sensor according to the fourth or the fifth embodiment.

As shown in FIG. 7, in the manufacturing method of the semiconductor acceleration sensor $Q_1$, at first the sensor element 12 is installed to the substrate 13 (Step S21). Then, ultraviolet rays are applied onto the surface of the inner wall portions 15–18 of the plastic package 14 so that the inner wall portions 15–18 are transformed (Step S22). The applying procedure of ultraviolet rays and the operations and effects thereof are as same as those of the first embodiment. It is natural that ultraviolet rays may be applied to only the inner wall portions 15 and 16, as described above.

Then, the substrate 13 (lower surface) is joined (adhered) to the upper surface of the pedestal shape inner wall portion 16 of the plastic package 14 using the preferable adhesive material 20 (Step S23). Next, the outer lead 21 is electrically connected to the upper surface of the substrate 13 (Step S24). Hereupon, the outer lead 21 may be connected to the substrate 13 before Step S23.

Then, a part of the hollow portion 19 which is situated above the substrate 13 or the pedestal shape inner wall portion 16, is filled (potted) with the potting resin 22 (Step S25). In result, a part of the hollow portion 19 which is situated under the substrate 13 becomes the closed hollow portion 23 in which the sensor element 12 is enclosed. Thus, the semiconductor acceleration sensor $Q_1$ is completed.

Thus, there is provided a semiconductor acceleration sensor $Q_1$ at low cost, in which the detecting accuracy of acceleration is improved, the adhesive characteristic of the adhering portion is improved, and also the airtightness of the closed hollow portion 23 in which the sensor element 12 is enclosed is improved.

<The Fifth Embodiment>

Figure 6:
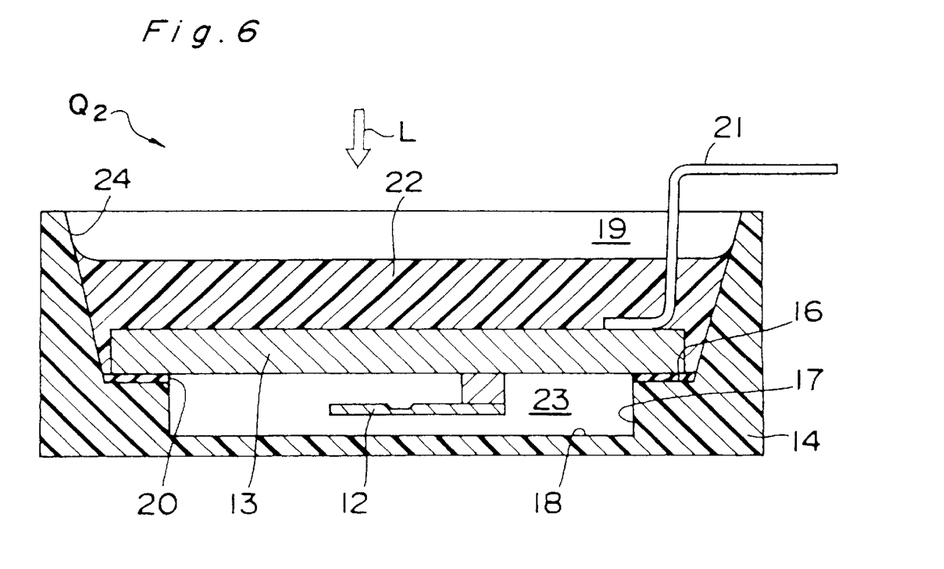
FIG. 6 is a sectional elevational view of a semiconductor sensor according to the fifth embodiment of the present invention.

In the above-mentioned semiconductor acceleration sensor $Q_1$ according to the fourth embodiment, the larger radius inner wall portion 15 of the plastic package 14 has a shape of cylinder whose radius is identical at all position in the upward-downward direction. In contrast with the above, in the semiconductor acceleration sensor $Q_2$ according to the fifth embodiment, as shown in FIG. 6, a larger radius inner wall 24 is formed in a shape of a taper spreading toward the opening thereof namely upward or outward. Then, the other structure of the semiconductor acceleration sensor $Q_2$ is as same as those of the semiconductor acceleration sensor $Q_1$ according to the fourth embodiment.

In the semiconductor acceleration sensor $Q_2$ according to the fifth embodiment, since the larger radius inner wall portion 24 is formed in a shape of taper, when ultraviolet rays are applied onto the larger radius inner wall portion 24 as indicated by the arrow L, the amount of the ultraviolet rays applied to the larger radius inner wall portion 24 increases, namely the applying efficiency of the ultraviolet rays is improved, so that the adhesive characteristic between the larger radius inner wall portion 24 and the potting resin 22 is still more improved. Thus, in the semiconductor acceleration sensor $Q_2$, the airtightness of the closed hollow portion 23 in which the sensor element 12 is enclosed, is further improved so that the reliability (quality) is still further improved.

The manufacturing method of the semiconductor acceleration sensor $Q_2$ is substantially as same as that of the semiconductor acceleration sensor $Q_1$ according to the fourth embodiment (see FIG. 7).

Although the present invention has been described in terms of preferred embodiments, it will be apparent to those of skill in the art that numerous variations and modifications may be made without departing from the true spirit and scope thereof, as set forth in the following claims.

What is claimed is:

1. A method of manufacturing a semiconductor sensor including a sensor element formed of semiconductor, a leading frame electrically connected to said sensor element and a resin package said package covering said sensor element and being adhered to said leading frame, said method comprising the steps of:

electrically connecting said sensor element to said leading frame;

applying ultraviolet rays to a contact portion of said package and a contact portion of said leading frame to improve an adhesive characteristic thereof; and adhering said contact portion of said package to said contact portion of said leading frame after said step of applying ultraviolet rays to said contact portion of said package and said contact portion of said leading frame.

2. A method of manufacturing a semiconductor sensor including a substrate, a sensor element which is loaded on said substrate and a resin package which is adhered to said substrate to cover said sensor element, said method comprising the steps of:

joining said sensor element to said substrate;

applying ultraviolet rays to a contact portion of said package to improve an adhesive characteristic thereof; and adhering said contact portion of said package to said substrate after said step of applying ultraviolet rays to said contact portion so as to cover said sensor element.

3. A method of manufacturing a semiconductor sensor including a sensor element, a substrate supporting said sensor element and a resin package which has a hollow portion therein, one end of said hollow portion being open to an outside of said package, said substrate being adhered to an inner wall of said package, said inner wall forming said hollow portion, and said semiconductor sensor further including a potting resin closing said hollow portion against the outside so as to enclose said sensor element and said substrate within a closed hollow portion, said method comprising the steps of:

installing said sensor element to said substrate;

applying ultraviolet rays to said inner wall to improve an adhesive characteristic thereof;

adhering said substrate to said inner wall after said step of applying ultraviolet rays to said inner wall; and potting said potting resin into said hollow portion so as to enclose said sensor element and said substrate within said hollow portion.

4. The semiconductor sensor recited in claim 1, wherein a surface of said leading frame is gold-plated.

5. The semiconductor sensor recited in claim 3, wherein said inner wall is formed in a shape of a taper spreading toward the outside.

6. The semiconductor sensor recited in claim 1, wherein said package is made of thermoplastic resin having a linear expansion coefficient similar to that of said sensor element.

7. The semiconductor sensor recited in claim 2, wherein said package is made of thermoplastic resin having a linear expansion coefficient similar to that of said sensor element.

8. The semiconductor sensor recited in claim 3, wherein said package is made of thermoplastic resin having a linear expansion coefficient similar to that of said sensor element.

9. The semiconductor sensor recited in claim 6, wherein said thermoplastic resin is polyphenylene sulfide resin (PPS) or polybutylene terephthalate resin (PBT).

10. The semiconductor sensor recited in claim 7, wherein said thermoplastic resin is polyphenylene sulfide resin (PPS) or polybutylene terephthalate resin (PBT).

11. The semiconductor sensor recited in claim 8, wherein said thermoplastic resin is polyphenylene sulfide resin (PPS) or polybutylene terephthalate resin (PBT).

* * * * *